US007900105B2

(12) United States Patent
Kapur et al.

(10) Patent No.: US 7,900,105 B2
(45) **Date of Patent: *Mar. 1, 2011**

(54) DYNAMICALLY RECONFIGURABLE SHARED SCAN-IN TEST ARCHITECTURE

(75) Inventors: Rohit Kapur, Cupertino, CA (US); Nodari Sitchinava, San Mateo, CA (US); Samitha Samaranayake, San Mateo, CA (US); Emil Gizdarski, Santa Clara, CA (US); Frederic J. Neuveux, Meylan (FR); Suryanarayana Duggirala, San Jose, CA (US); Thomas W. Williams, Boulder, CO (US)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/779,018

(22) Filed: May 12, 2010

(65) Prior Publication Data

US 2010/0223516 A1 Sep. 2, 2010

Related U.S. Application Data

(60) Continuation of application No. 12/178,504, filed on Jul. 23, 2008, now Pat. No. 7,743,299, which is a division of application No. 10/856,105, filed on May 28, 2004, now Pat. No. 7,418,640.

(51) Int. Cl.
*G01R 31/28* (2006.01)

(52) U.S. Cl. ...................................... 714/726; 714/729

(58) Field of Classification Search ................. 714/724, 714/726, 729, 733, 734, 30, 3, 7; 716/4
See application file for complete search history.

(56) References Cited

U.S. PATENT DOCUMENTS

| | | | |
|---|---|---|---|
| 5,696,771 | A | 12/1997 | Beausang et al. |
| 5,703,789 | A | 12/1997 | Beausang et al. |
| 5,903,466 | A | 5/1999 | Beausang et al. |
| 5,949,626 | A | 9/1999 | Sato et al. |
| 5,983,380 | A | 11/1999 | Motika et al. |
| 6,018,815 | A | 1/2000 | Baeg |
| 6,055,649 | A | 4/2000 | Deao et al. |
| 6,212,656 | B1 | 4/2001 | Fosco et al. |
| 6,442,723 | B1 | 8/2002 | Koprowski et al. |
| 6,516,432 | B1 | 2/2003 | Motika et al. |
| 6,543,020 | B2 | 4/2003 | Rajski et al. |
| 6,557,129 | B1 | 4/2003 | Rajski et al. |
| 6,560,147 | B2 | 5/2003 | Yoshiyama |
| 6,587,996 | B1 | 7/2003 | Reohr, Jr. et al. |
| 6,662,327 | B1 | 12/2003 | Rajski |
| 6,684,358 | B1 | 1/2004 | Rajski et al. |
| 6,708,303 | B1 | 3/2004 | Gallia |
| 6,807,645 | B2 | 10/2004 | Angelotti et al. |
| 6,904,553 | B1 | 6/2005 | Brown |
| 6,961,886 | B2 | 11/2005 | Motika et al. |
| 6,990,619 | B1 | 1/2006 | Kapur et al. |

(Continued)

*Primary Examiner*—Phung M Chung
(74) *Attorney, Agent, or Firm*—Bever, Hoffman & Harms, LLP; Jeanette S. Harms

(57) ABSTRACT

A low overhead dynamically reconfigurable shared scan-in test architecture is provided. This test architecture advantageously allows for changing scan inputs during the scan operation on a per shift basis. The flexibility of reconfiguring the scan input to scan chain mapping every shift cycle can advantageously reduce both test data volume and test application time.

35 Claims, 14 Drawing Sheets

U.S. PATENT DOCUMENTS

| | | | | |
|---|---|---|---|---|
| 7,137,053 | B2 | 11/2006 | Khoche et al. | |
| 7,237,162 | B1 | 6/2007 | Wohl et al. | |
| 7,412,637 | B2 | 8/2008 | Wang et al. | |
| 7,418,640 | B2 | 8/2008 | Kapur et al. | |
| 7,596,733 | B2 * | 9/2009 | Kapur et al. | 714/726 |
| 2003/0046623 | A1 | 3/2003 | Khoche et al. | |

* cited by examiner

| | | |
|---|---|---|
| 0 1 2 | 0 1 2 | 0 1 2 |
| 0 1 2 | 1 2 0 | 2 0 1 |
| 0 1 2 | 2 0 1 | 1 2 0 |

Figure 8A

| | | |
|---|---|---|
| 0 1 2 3 | 0 1 2 3 | 0 1 2 3 |
| 0 1 2 3 | 1 2 3 0 | 2 3 0 1 |
| 0 1 2 3 | 2 3 0 1 | 1 2 3 0 |

Figure 8B

| | | | | |
|---|---|---|---|---|
| 0 1 2 3 4 | 0 1 2 3 4 | 0 1 2 3 4 | 0 1 2 3 4 | 0 1 2 3 4 |
| 0 1 2 3 4 | 1 2 3 4 0 | 2 3 4 0 1 | 3 4 0 1 2 | 4 0 1 2 3 |
| 0 1 2 3 4 | 2 3 4 0 1 | 4 0 1 2 3 | 1 2 3 4 0 | 3 4 0 1 2 |
| 0 1 2 3 4 | 3 4 0 1 2 | 1 2 3 4 0 | 4 0 1 2 3 | 2 3 4 0 1 |
| 0 1 2 3 4 | 4 0 1 2 3 | 3 4 0 1 2 | 2 3 4 0 1 | 1 2 3 4 0 |

Figure 8C

| | | | | |
|---|---|---|---|---|
| 0 1 2 3 4 5 | 0 1 2 3 4 5 | 0 1 2 3 4 5 | 0 1 2 3 4 5 | 0 1 2 3 4 5 |
| 0 1 2 3 4 5 | 1 2 3 4 5 0 | 2 3 4 5 0 1 | 3 4 5 0 1 2 | 4 5 0 1 2 3 |
| 0 1 2 3 4 5 | 2 3 4 5 0 1 | 4 5 0 1 2 3 | 0 1 2 3 4 5 | 2 3 4 5 0 1 |
| 0 1 2 3 4 5 | 3 4 5 0 1 2 | 0 1 2 3 4 5 | 3 4 5 0 1 2 | 0 1 2 3 4 5 |
| 0 1 2 3 4 5 | 4 5 0 1 2 3 | 2 3 4 5 0 1 | 0 1 2 3 4 5 | 4 5 0 1 2 3 |

Figure 8D

DYNAMICALLY RECONFIGURABLE SHARED SCAN-IN TEST ARCHITECTURE

RELATED APPLICATIONS

This application is a continuation of U.S. patent application Ser. No. 12/178,504, entitled "Dynamically Reconfigurable Shared Scan-In Test Architecture" filed Jul. 23, 2008, now U.S. Pat. No. 7,743,299, which is a divisional of U.S. patent application Ser. No. 10/856,105, entitled "Dynamically Reconfigurable Shared Scan-In Test Architecture" filed May 28, 2004, now U.S. Pat. No. 7,418,640.

BACKGROUND OF THE INVENTION

1. Field of the Invention

The present invention relates to test architectures for integrated circuits, and in particular to test architectures that allows changing values on the scan configuration signals during the scan operation on a per shift basis.

2. Description of the Related Art

Larger and more complex logic designs in integrated circuits (ICs) lead to demands for more sophisticated testing to ensure fault-free performance of those ICs. This testing can represent a significant portion of the design, manufacture, and service cost of ICs. In a simple model, testing of an IC can include applying multiple test patterns to the inputs of a circuit and monitoring its outputs to detect the occurrence of faults. Fault coverage indicates the efficacy of the test pattern in detecting each fault in a universe of potential faults. Thus, if a set of patterns is able to detect substantially every potential fault, then fault coverage approaching 100% has been achieved.

To facilitate better faults coverage and minimize test cost, DFT (design-for-test) can be used. In one DFT technique, structures in the logic design can be used. Specifically, a logic design implemented in the IC generally includes a plurality of state elements, e.g. sequential storage elements like flip-flops. These state elements can be connected into scan chains of computed lengths, which vary based on the design. In one embodiment, all state elements in the design are scannable, i.e. each state element is in a scan chain. The state elements in the scan chains are typically called scan cells. In DFT, each scan chain includes a scan-input pin (also called a scan input herein) and a scan-output pin, which serve as control and observation nodes during the test mode.

The scan chains are loaded with the test pattern by clocking in predetermined logic signals through the scan cells. Thus, if each scan chain includes 500 scan cells, then 500 clock cycles are used to complete the loading process. Note that, for simplicity, the embodiments provided herein describe scan chains of equal length. In actual embodiments, DFT attempts to create, but infrequently achieves, this goal. Thus, in actual embodiments, software can compensate for the different scan chain lengths, thereby ensuring that outputs from each test pattern are recognized and analyzed accordingly. This methodology is known to those skilled in the art and therefore is not explained in detail herein.

Typically, the more complex the design, the more flip-flops are included in the design. Unfortunately, with relatively few inputs and outputs of the design that can be used as terminals for the scan chains, the number of flip-flops per scan chain has increased dramatically. As a result, the time required to operate the scan chains, called herein the test application time, has dramatically increased.

FIG. 1A illustrates a standard flow 100 for processing a single scan test pattern. In flow 100, step 101 sets up the scan chain configuration using flip-flops in the design, thereby identifying the scan cells of the scan chain. Step 102 shifts the scan-in values into the active scan chains. Step 103 exits the scan configuration. Step 104 applies stimulus to the test circuit inputs and measures the outputs. Step 105 pulses the clocks to capture the test circuit response in the flip-flops. Step 106 sets up the scan chain configuration. Step 107 shifts the scan-out values from the active scan chains. Step 108 exits the scan configuration.

For clarification of various steps, FIG. 1B illustrates a portion of a generic design including logic 121 and flip-flops 123. In step 101, multiplexers 122 can be added between logic 121 and flip-flops 123. Using a scan_enable (i.e. a control) signal, multiplexers 122 can be configured to allow scan-in values to be shifted into flip-flops 123 without going through logic 121 in step 102. In step 103, multiplexers 122 can be reconfigured to accept values from logic 121. At this point, stimulus can be applied to the test circuit in step 104. A pulse can be applied to the clock CLK terminals of flip-flops 123 to capture the resulting values in step 105. In step 106, multiplexers 122 can be reconfigured to shift those resulting values out through the scan chain comprising flip-flops 123. Step 108 marks the end of processing a single scan test pattern.

Notably, steps 101, 103-106, and 108 take only one clock period on the tester. However, each shift operation, e.g. steps 102 and 107, take as many clock periods as the longest scan chain. In a complex design, 200,000 flip-flops may be included. Assuming that only 10 scan chains can be provided, each scan chain would then have 20,000 (200,000/10) flip-flops, thereby requiring 20,000 clock cycles to process a single scan test pattern. Therefore, irrespective of any optimization achieved by overlapping scan operations of adjacent test patterns, test application time is dominated by the scan operation.

To detect a single fault, only a limited number of values of the test pattern may be used for fault detection. In fact, for typical test patterns, only 2% of the scan-in values may be used to test a fault. The remainder of the test pattern, i.e. the part of the test pattern not contributing to fault detection, can be filled with "don't care" values (also called logic X's).

Deterministic automatic test pattern generation (ATPG) can be used to generate the minimum set of patterns while providing fault coverage close to 100%. Specifically, in deterministic ATPG, each test pattern is designed to test for the maximum number of faults. However, even with the reduction in test patterns, deterministic ATPG patterns for complex designs still require significant storage area in the test-application equipment for the large number of patterns that are input directly to the scan chains as well as for the expected output values from the scan chains.

Therefore, a need arises for a test architecture and method that significantly reduces test data volume and test application time in an area-efficient manner.

BRIEF DESCRIPTION OF THE FIGURES

FIGS. 8A, 8B, 8C, and 8D illustrate tables showing exemplary rotation mappings for three, four, five, and six scan inputs, respectively.

SUMMARY OF THE INVENTION

A low overhead dynamically reconfigurable shared scan-in test architecture is provided. This test architecture advantageously allows for changing scan inputs during the scan operation on a per shift basis. The flexibility of reconfiguring the scan input to scan chain mapping every shift cycle can advantageously reduce both test data volume and test application time.

Figure 1A:
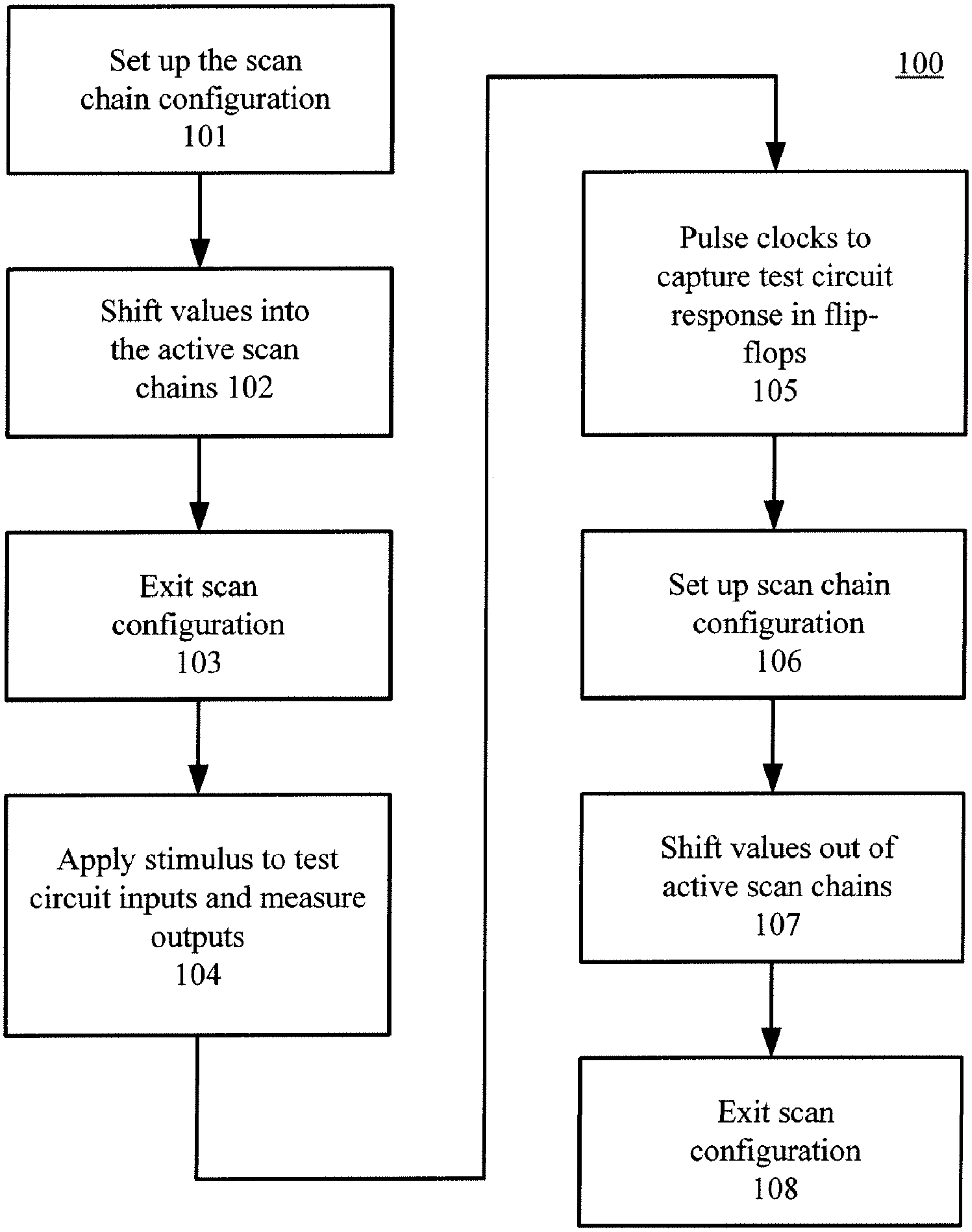
FIG. 1A illustrates a standard flow 100 for processing a single scan test pattern.
Figure 1B:
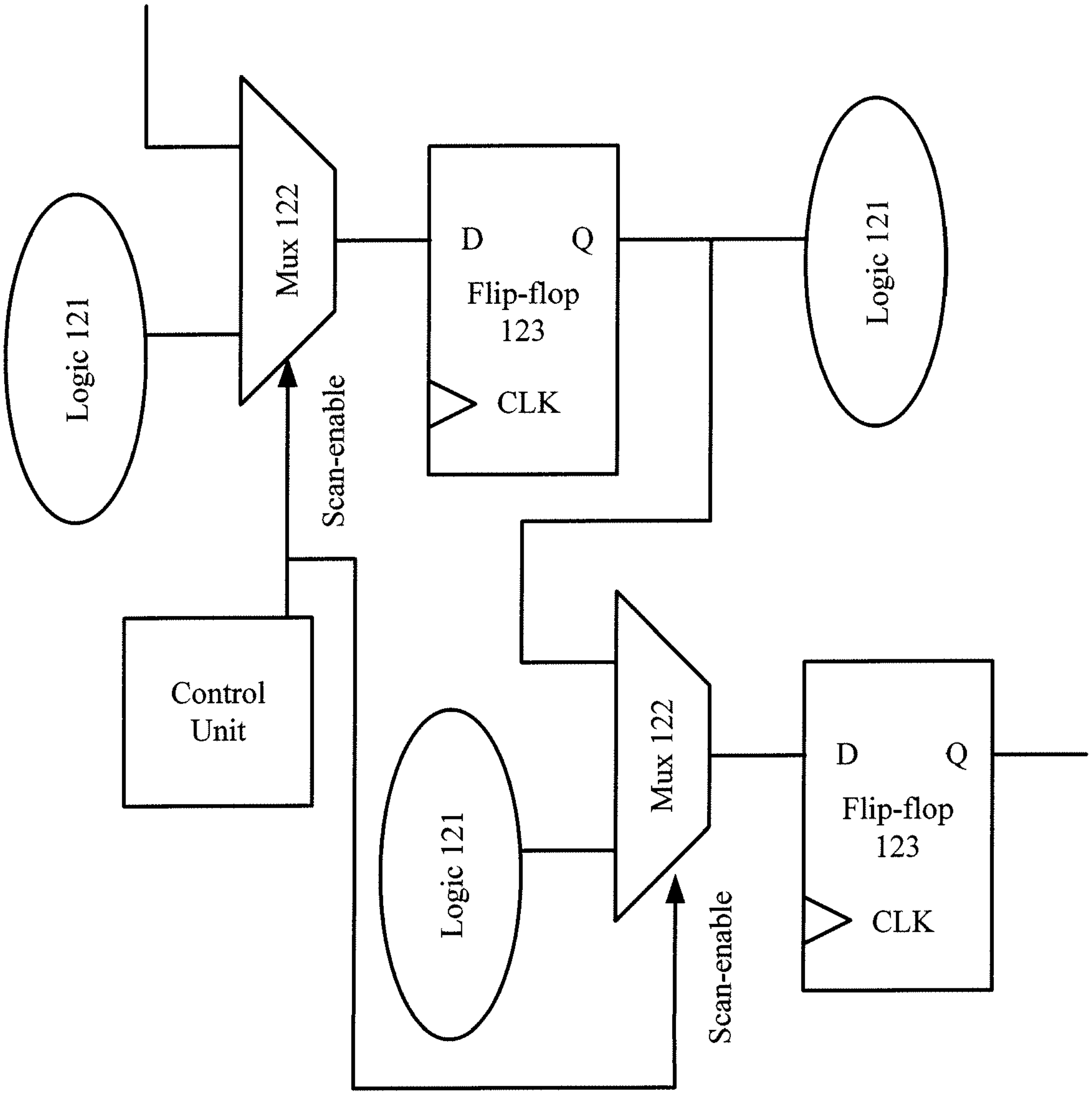
FIG. 1B illustrates a portion of a generic design including logic and flip-flops.

This re-configurability feature can be implemented using multiplexing logic, e.g. multiplexers that can selectively connect the scan inputs to the scan chains. The control signals of this multiplexing determine the selected configuration. These control signals must be independent of the other scan-enable signals of the scan chains (see FIG. 1B). In one embodiment, each multiplexer can selectively couple a scan input to a plurality of scan chains.

In one embodiment, each configuration can use a number of scan inputs that is relatively prime to numbers used by other configurations. Of importance, to maximize data volume reduction, the configuration using the largest scan-in fan-out (i.e. the smallest number of scan inputs) can be used first. If that configuration results in a conflict of scan-in values, then the number of scan inputs can be increased for the next configuration, thereby decreasing the probability of conflict. In accordance with one use of the dynamically reconfigurable shared scan-in test architecture, successive configurations can be used until no conflict occurs.

In one embodiment, successive configurations can use 2, 3, 5, 7, 11 . . . scan inputs. Thus, if three configurations are to be constructed with 12 scan chains, then the following scan input mapping can be generated wherein the scan chains can be numbered $sc_1$, $sc_2$, . . . , $sc_{12}$ and the scan inputs can be numbered $si_1$, $si_2$, . . . , $si_m$. The first configuration can use 2 scan inputs. In this case, all the odd numbered scan chains can be connected to scan input $si_1$ and all the even numbered scan chains can be connected to scan input $si_2$. The second configuration uses 3 scan inputs, where the scan chains connected to scan input $si_1$ are $sc_1$, $sc_4$, $sc_7$, $sc_{10}$, the scan chains connected to scan input $si_2$ are $sc_2$, $sc_5$, $sc_8$, $sc_{11}$ and the scan chains connected to scan input $si_3$ are $sc_3$, $sc_6$, $sc_9$, $sc_{12}$. The third configuration can use 5 scan inputs, wherein scan input $si_1$ is connected to scan chains $sc_1$, $sc_6$, $sc_{11}$ scan input $si_2$ is connected to scan chains $sc_2$, $sc_7$, $sc_{12}$, scan input $si_3$ is connected to $sc_3$, $sc_8$, scan input $si_4$ is connected to scan chains $sc_3$, $sc_8$, and scan input $si_4$ is connected to scan chains $sc_5$, $sc_{10}$.

Advantageously, a conflict that occurs within one configuration (e.g. the configuration with 2 scan inputs) can be resolved by using the next configuration (i.e. the configuration with 3 scan inputs). Because the number of scan inputs can be dynamically changed on a per shift basis, conflicts in a test pattern can be resolved using a small number of configurations (e.g. 3 configurations). Thus, a dynamically reconfigurable scan-in technique can quickly and efficiently match the needs of a test pattern, thereby significantly improving test data volume and test application time compared to a static-only configuration.

In another embodiment, scan inputs can be mapped to scan chains using a rotation method. In this case, the ordering of the scan inputs for successive configurations can change after each application of a scan input set (e.g. scan inputs 0, 1, and 2). For example, a first configuration could provide a rotation of zero (e.g. 012, 012, 012), whereas a second configuration could provide a rotation of one (e.g. 012, 120, 201).

In a method of performing a scan operation on a test design using the dynamically reconfigurable shared scan-in test architecture is also provided. In this method, a first set of scan inputs can be mapped to a first plurality of scan chains (i.e. a first configuration) on a first shift cycle. If the first configuration results in at least one conflict, then a second set of scan inputs can be mapped to a second plurality of scan chains (i.e. a second configuration) on a second shift cycle. Notably, a membership of scan cells within each scan chain is the same for the first and second configurations. Additional configurations can be used as necessary to eliminate conflicts.

A method of forming a dynamically reconfigurable shared scan-in test architecture is also provided. This method, which can be performed using a computer-implemented software program, includes creating scan chains without association to scan inputs using cones of influence (i.e. determining scan cell membership to a scan chain) and then creating an association between the scan chains and a variable number of scan inputs (i.e. determining scan input mapping). Creating the association between the scan chains and the variable number of scan inputs can include defining a plurality of configurations. Defining the plurality of configurations can include using a predetermined number of scan inputs for each configuration. In one embodiment, successive configurations can use 2, 3, 5, 7, 11 . . . scan inputs. In another embodiment, mapping of scan inputs to scan chains can be done using a rotation method. Advantageously, both scan cell membership and scan input mapping can be determined without any design analysis.

DETAILED DESCRIPTION OF THE FIGURES

To detect a single fault, only a limited number of scan-in values of the test pattern may be used for fault detection. The remainder of the test pattern includes “don’t care” values. Taking into account the large number of don’t care values in any pattern, some test architectures attempt to share scan-in values to decrease data volume. For example, a test architecture called Illinois Scan uses a limited number of common scan inputs to allow for the don’t cares of the scan cells to be filled with the same values as those in other scan cells.

Figure 2:
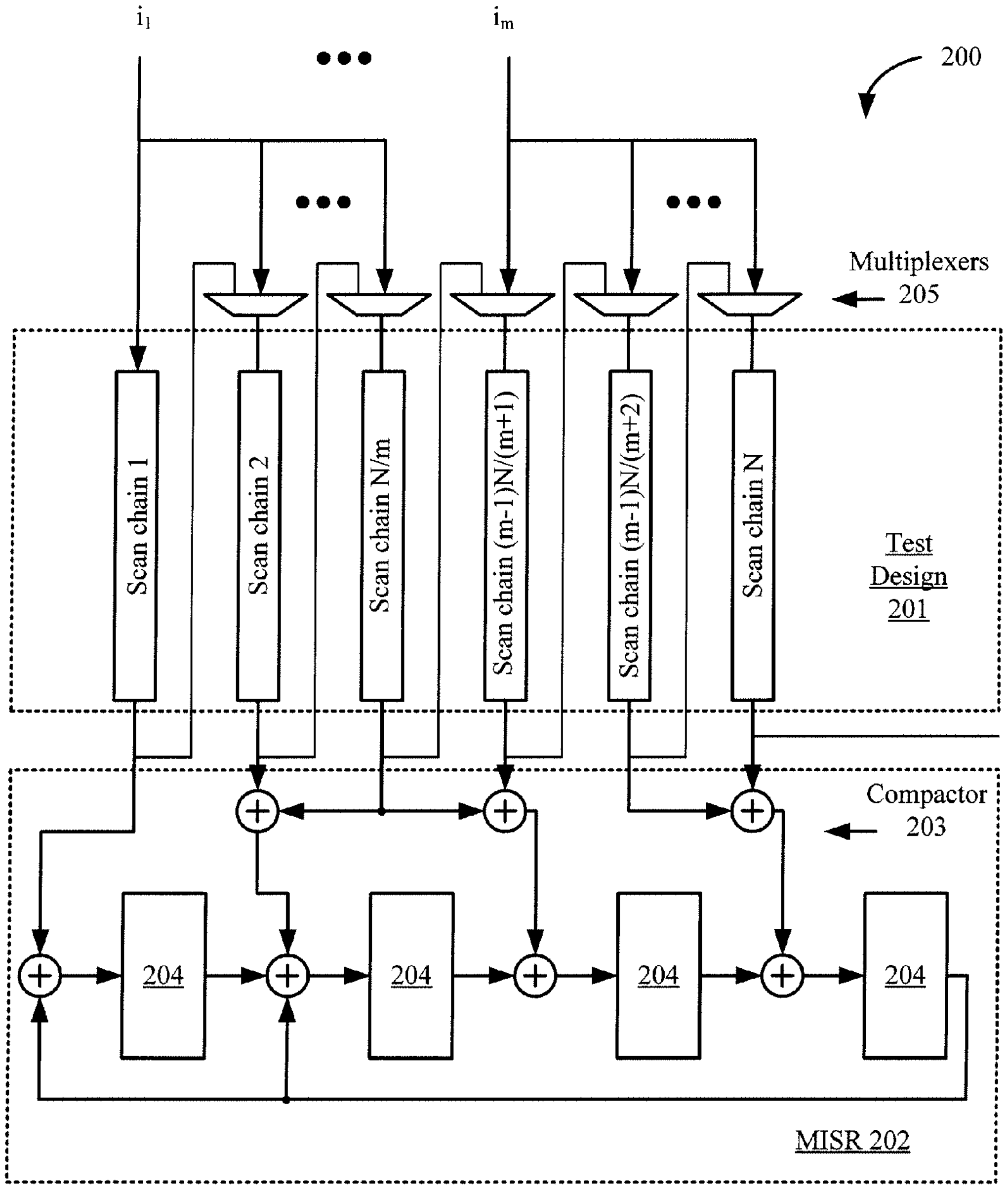
FIG. 2 illustrates an exemplary Illinois Scan architecture including N scan chains and m scan inputs.

FIG. 2 illustrates an exemplary Illinois Scan architecture 200 including N scan chains and m scan inputs. In architecture 200, each scan-in value is provided to N/m scan chains. Because m represents a number consistent with conventional scan architectures, the shared scan-in values allow for many shorter scan chains compared to conventional scan architectures. After the scan-in values are processed through test design 201, a MISR 202 can be used to compact the responses. In one embodiment, MISR 202 can include a compactor 203 and a plurality of flip-flops 204.

Figure 3A:
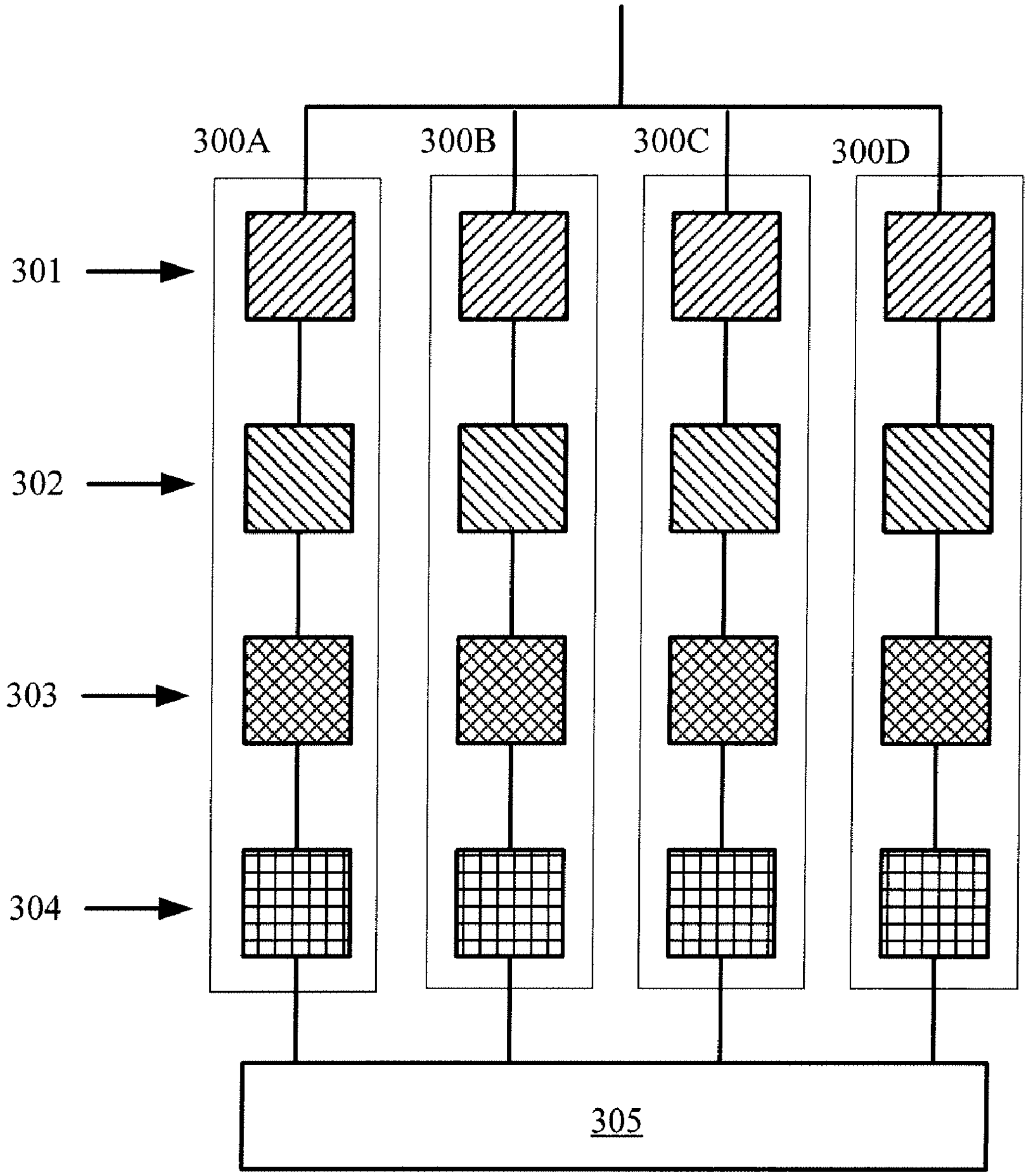
FIGS. 3A and 3B illustrate exemplary dependencies for shared scan inputs.
Figure 3B:
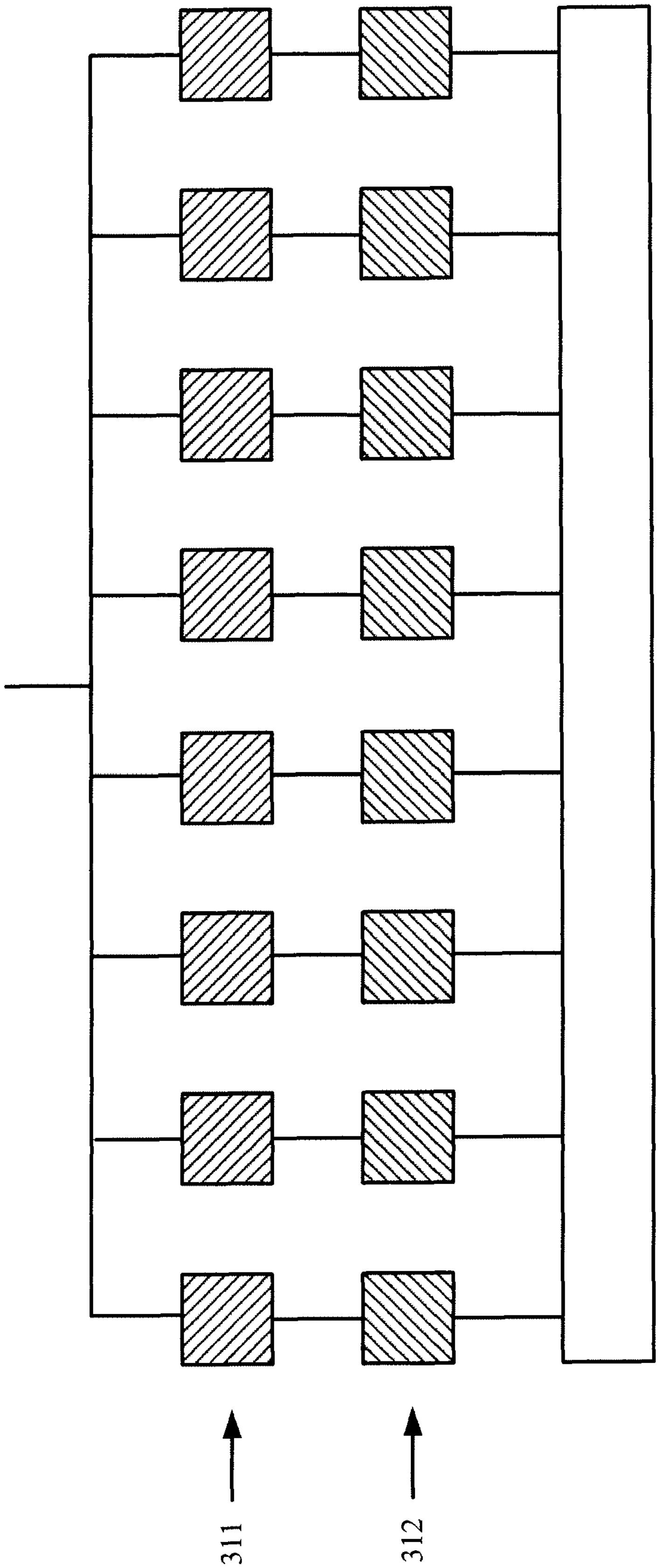

In architecture 200, the scan chains sharing the same scan-in value have certain dependencies. For example, FIGS. 3A and 3B illustrate exemplary dependencies. In FIG. 3A, a scan-in value is shared by four scan chains 300A, 300B, 300C, and 300D (a MISR 305 is shown for reference). In this simplified embodiment, each scan chain includes four scan cells (e.g. flip-flops), which are represented by squares. Scan cells having the same fill pattern have been provided the same scan-in value. Thus, each of scan cell sets 301, 302, 303, 304 stores the same value in a scan operation (wherein, for example, a scan-in value stored by scan cell set 301 is shifted to scan cell set 302 after a clock is applied). FIG. 3B illustrates a more aggressive sharing of a scan-in value wherein each of scan cell sets 311 and 312 includes eight scan cells. Therefore, in this configuration, a scan-in value is shared by eight scan chains.

Logically, if a single scan-in value is provided to only a few scan chains, then the probability of a scan cell requiring an opposite value to that of the scan-in value is very low. In contrast, if a single scan-in value is provided to many scan chains, then the probability of a scan cell requiring an opposite value to that of the scan-in value is very high. Therefore, increasing the sharing (i.e. fan-out) of a scan-in value can decrease data volume at the risk of increasing conflict.

Test architectures must also take into account test application time. For example, in a complex design, if only a few scan inputs are available (and thus a corresponding number of scan chains), then the number of scan cells in each scan chain can be great, thereby undesirably increasing test application time. In contrast, if many scan inputs (and thus scan chains) are available, then the number of scan cells in such scan chains can be decreased, thereby reducing test application time. Therefore, for example, the scan-in configuration of FIG. 3B could significantly reduce test application time compared to the scan-in configuration of FIG. 3A.

In a shared scan-in architecture, both test data volume and test application time can be reduced only when the dependencies do not conflict with test pattern requirements. In other words, if the test pattern does not require different scan-in values for a scan cell set, then no conflict exists. If a test pattern can use a shared scan-in architecture, then the test data volume as well as the test application time can be reduced by a factor of Z, wherein Z corresponds to the number of scan chains receiving a scan-in value. For example, in FIG. 3A, both the test data volume and test application time can be reduced by a factor of four if no conflict exists.

Conflicts in the scan cell set require a shared scan-in architecture to resort to other scan methods. For example, referring back to FIG. 2, a plurality of multiplexers 205 can be used to receive both the scan-in value as well as an output of a preceding scan chain, if present. In this configuration, if a test pattern results in a conflict within a scan cell set, then the test pattern can be applied through a traditional serial scan chain formed by scan chains 1-N using multiplexers 205. Unfortunately, after a serial scan chain configuration is used, architecture 200 cannot revert back to the shared scan-in configuration. Notably, the use of a serial scan chain eliminates any further test data volume or test application time reduction.

A dynamically reconfigurable shared scan-in test architecture can advantageously reduce conflicts while still reducing test data volume and test application time. In accordance with one feature of this dynamically reconfigurable shared scan-in test architecture, multiplexing logic (e.g. multiplexers) can be used at the beginning of the scan chains to allow for multiple alliances between the scan inputs and the scan chains.

Figure 4:
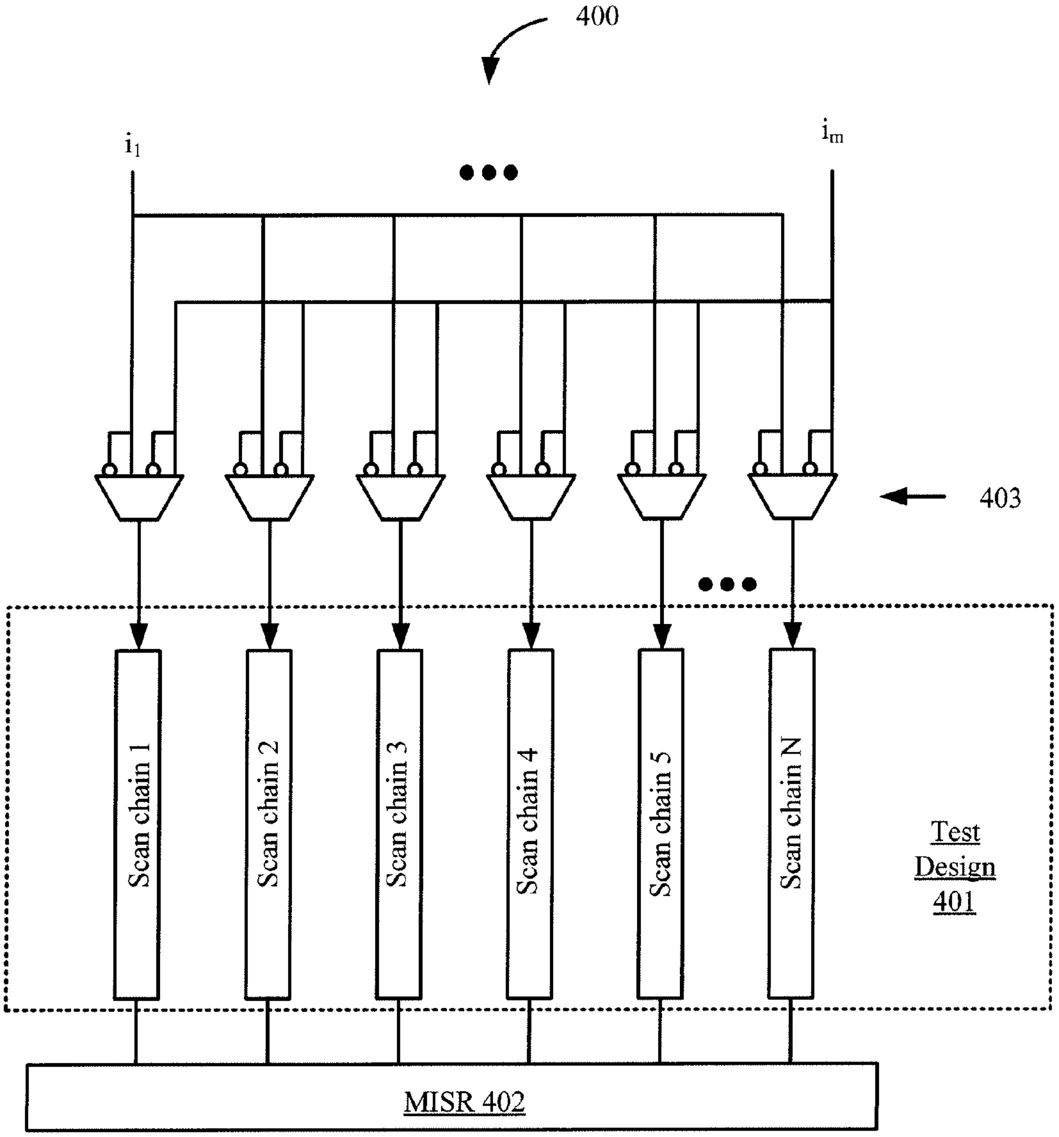
FIG. 4 illustrates an exemplary dynamically reconfigurable shared scan-in test architecture that allows for changing scan inputs on a per shift basis.

FIG. 4 illustrates an exemplary dynamically reconfigurable shared scan-in test architecture 400 including a plurality of scan chains 1-N formed in a test design 401 (a MISR 402 is shown for reference). In architecture 400, each of a plurality of multiplexers 403 can be coupled to receive the signals on scan inputs Note that in this embodiment, multiplexers 403 can also be coupled to receive the inverted signals provided on scan inputs $i_1$-$i_m$.

Based on their control signals, multiplexers 403 select N scan-in values to be provided to scan chains 1-N.

Specifically, using one setting of the multiplexer control signals, a scan chain can be connected to a particular scan input and in another setting the same scan chain can be connected to a different scan input. Note that multiple scan chains can be connected to the same scan input—and hence would get the same scan-in value.

The multiplexer control can be kept constant during the application of a test. Alternatively, multiplexer control can be dynamically changed while applying the same test. Advantageously, changing the multiplexer control during the scan operation provides dynamism in the test architecture that is the equivalent of a larger number of static reconfigurations. This dynamically reconfigurable feature dramatically increases the probability that a test pattern can be applied without conflict. FIGS. 5A-5D illustrate a simplified example of this dynamically reconfigurable feature.

Figure 5A:
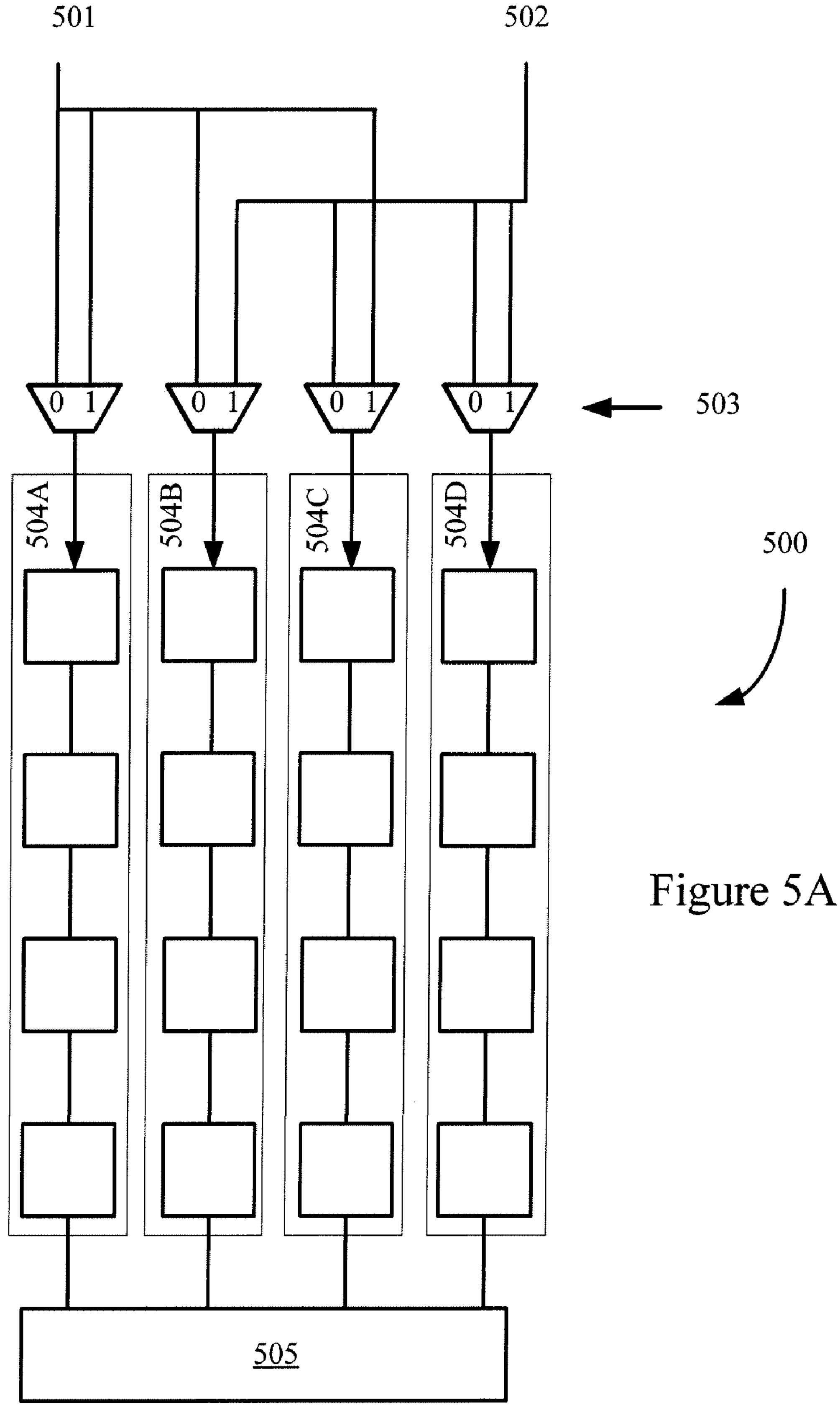
FIGS. 5A-5D illustrate a simplified example of a dynamically reconfigurable feature.

FIG. 5A illustrates a test design 500 that includes 16 scan cells configured into 4 scan chains 504A-504D (scan-out logic 505 is shown for reference). These scan chains are connectable to two scan inputs 501 and 502 through multiplexers 503. In this simplified example, each of multiplexers 503 is a 2-to-1 multiplexer having a “0” and a “1” input terminal, wherein a logic 0 control signal selects the value on the “0” input terminal and a logic 1 control signal selects the value on the “1” input terminal. In the embodiment shown in FIG. 5A, scan input 501 is connectable to scan chains 504A, 504B, and 504C. Scan input 502 is connectable to scan chains 504B, 504C, and 504D.

Figure 5B:
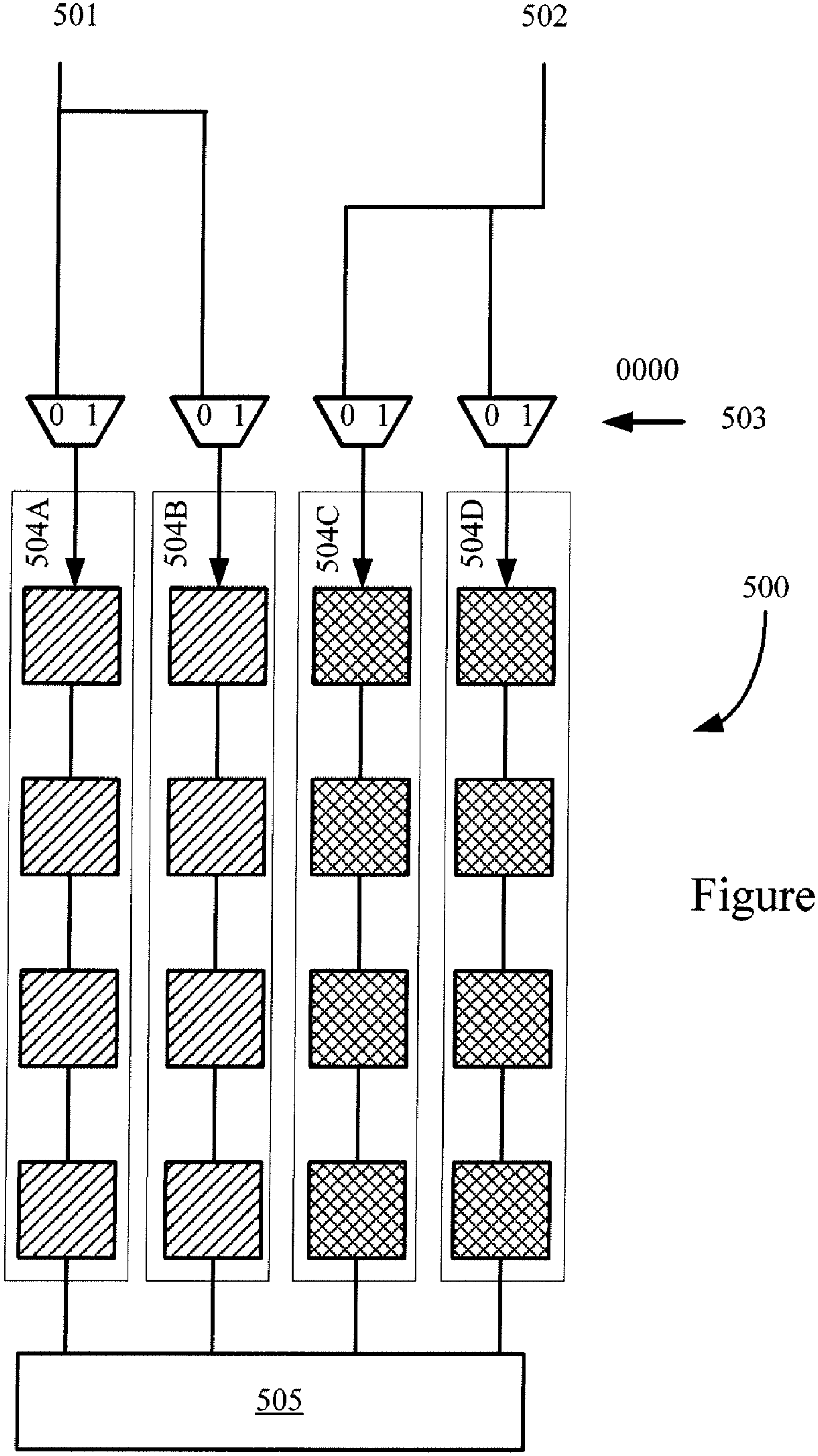
Figure 5C:
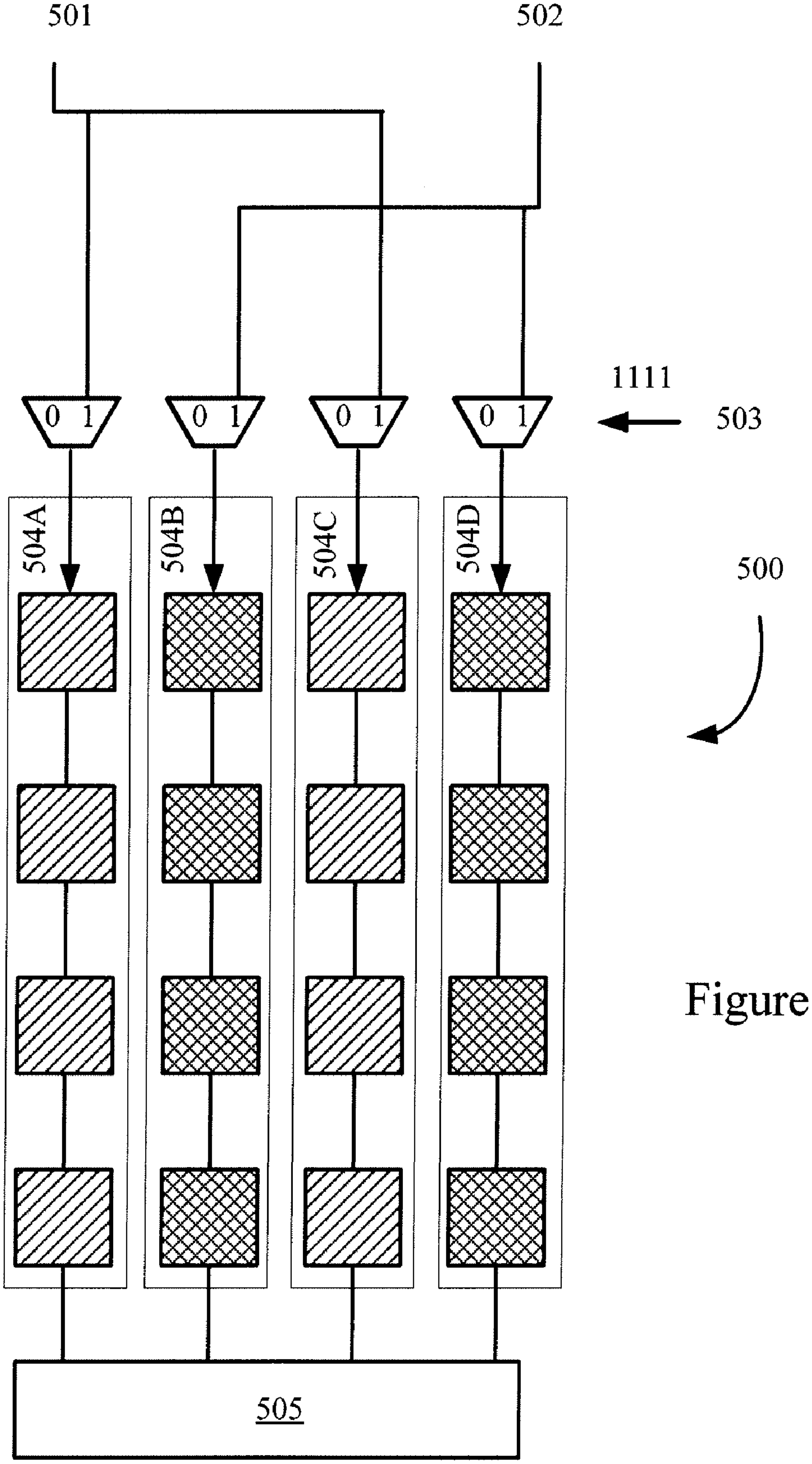

When the multiplexer control signal is static for the scan only two configurations are possible. As used herein, the term “configuration” refers to a membership of scan chains to scan inputs. For example, FIG. 5B shows the configuration when the multiplexer control signal is “0000” during scan. The scan cells of scan chains 504A-504D have fill patterns to show their relationship to the scan inputs. In this configuration, scan chains 504A and 504B are connected to the scan input 501 whereas scan chains 504C and 504D are connected to scan input 502. Similarly, FIG. 5C shows the configuration when the multiplexer control signal is “1111” during scan. In this configuration, scan chains 504A and 504C are connected to scan input 501 and scan chains 504B and 504D are connected to scan input 502.

Figure 5D:
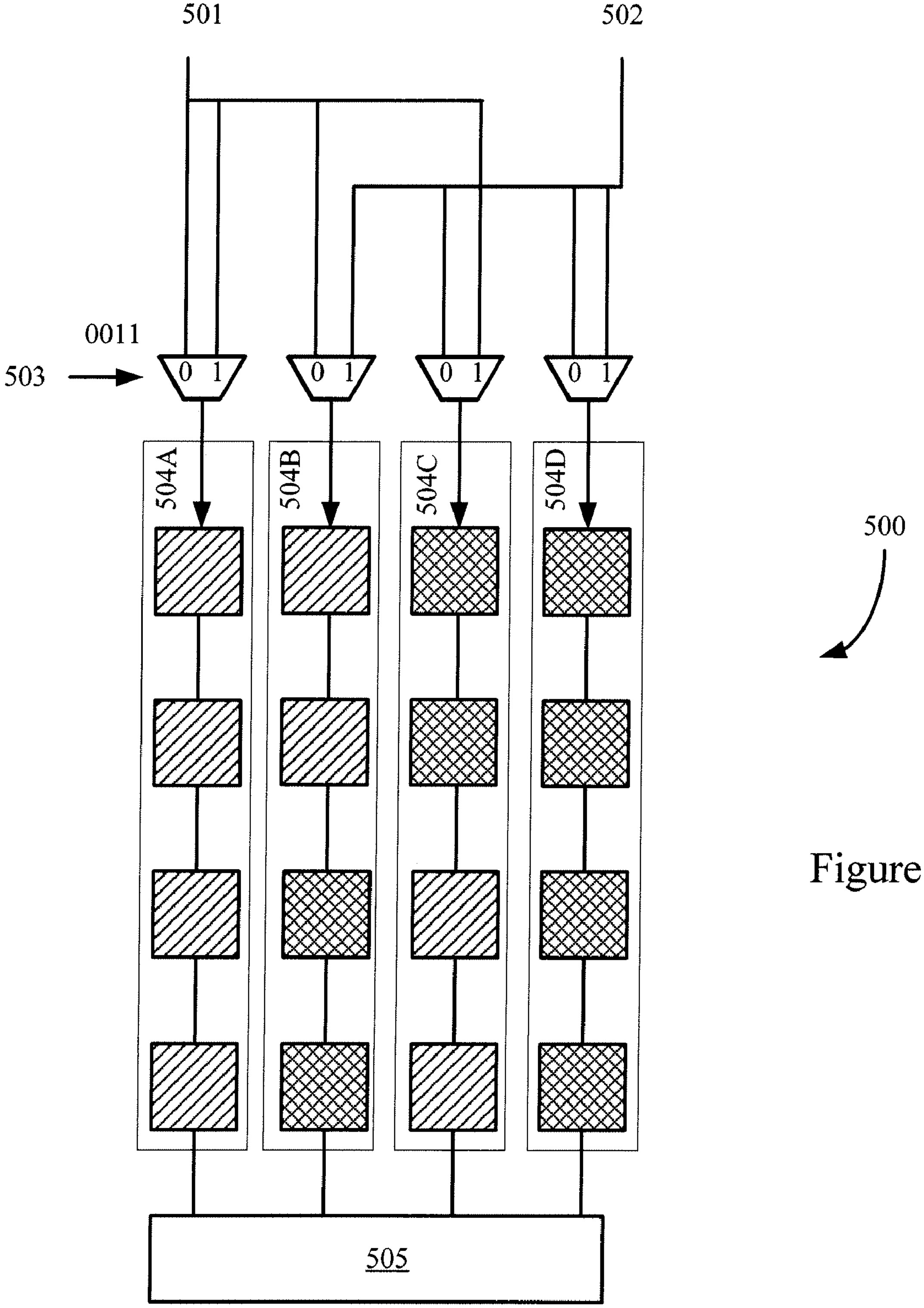

Of importance, when the multiplexer control signal is changed during scan, significantly more configurations are possible as each shift could take on one of the available static configurations. For example, FIG. 5D shows the scan-in fanout when the multiplexer control signal is “0011” during scan (i.e. the multiplexer control signals is logic 1 for the first two shift cycles and then logic 0 for the remaining two shift cycles).

Note that many test patterns could have conflicts in certain shift locations such that neither of the static configurations shown in FIGS. 5B and 5C could be used. However, these same test patterns having the same conflicts in the same shift locations could be applied in the dynamic configuration shown in FIG. 5D. The ability to have many more configurations at the expense of some test data on the multiplexer control allows the dynamically reconfigurable shared scan-in test architecture to provide a very efficient platform for test patterns.

Note that dynamic reconfiguration requires that the timing of the multiplexer control signal be adjusted to match the shift operation. Additionally, the multiplexer control signals can be separate from the other scan-enable signals of the scan chains. Because shifting is normally done at a much slower speed than the operation of the design, this adjustment can be easily achievable.

Figure 6:
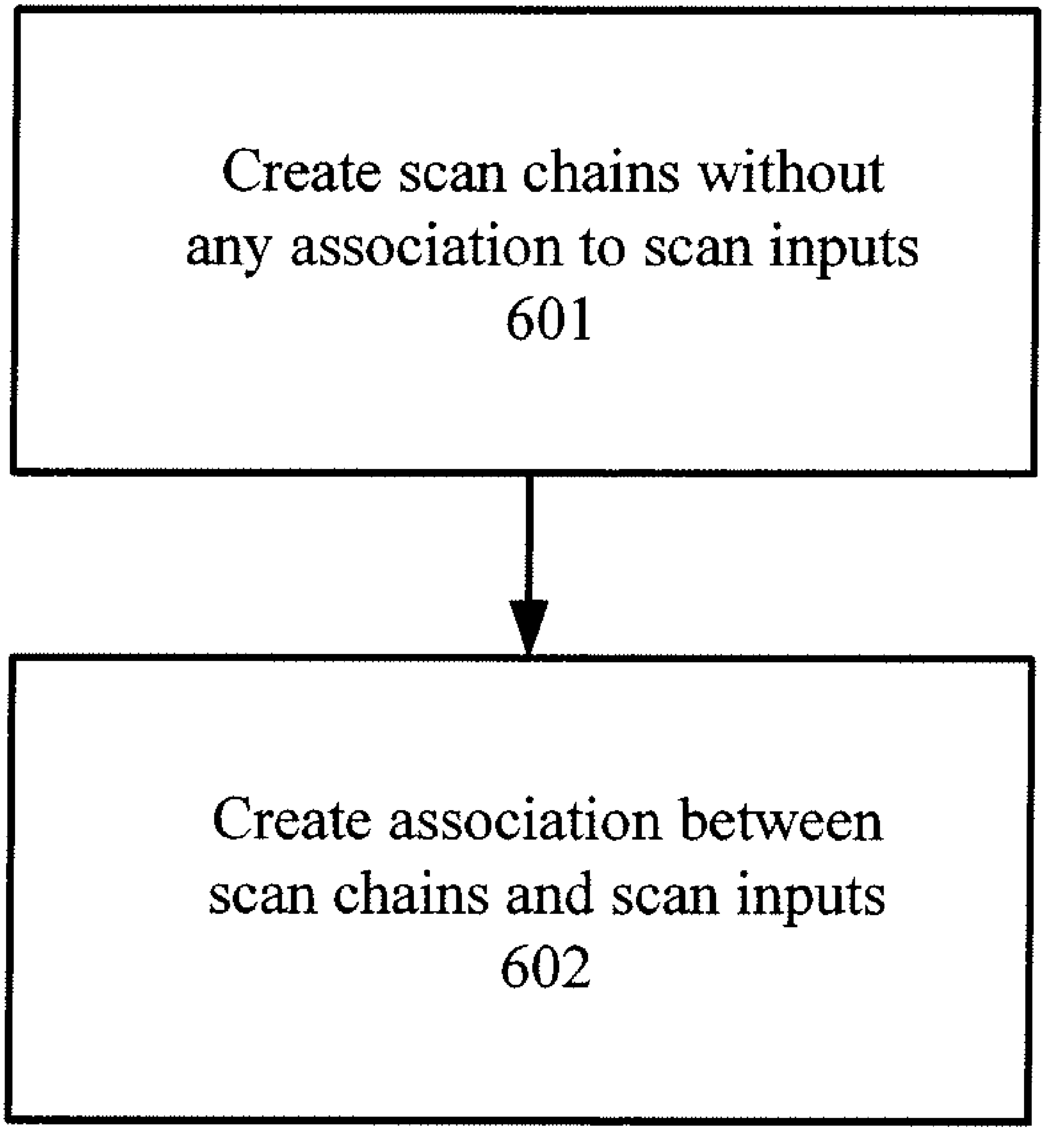
FIG. 6 illustrates a technique to create a dynamically reconfigurable shared scan-in test architecture.

FIG. 6 illustrates a technique to create a dynamically reconfigurable shared scan-in test architecture. This technique can be advantageously implemented using a computer (or any other suitable device) running a software program. In step 601, the scan chains can be created without any association to scan inputs. In step 602, the association between the scan chains and the scan inputs can be created for each configuration. These steps will now be explained in further detail.

In step 601, the goal is to construct scan chains such that the number of potential conflicts between scan chains is minimized. A potential conflict is defined to exist between any pair of scan cells that belong to the same "cone" of influence and are placed in two different scan chains. A cone of influence (hereinafter cone) refers to flip-flops and the logic that those flip-flops drive (e.g. flip-flops 123 and logic 121 of FIG. 1B would be considered in the same cone of influence).

Tests for faults in a cone require values from the scan cells driving the cone. Scan values required from scan cells in the same scan chain can never conflict. The potential conflict becomes a real conflict when the event occurs that satisfies all of the following additional criteria.

1. Values needed in two scan cells are not compatible (a logic 0 and a logic 1).

2. The two scan cells are in the same shift position relative to the scan-in of the chains.

3. The two scan cells are in scan chains that are sharing the same scan-in.

Thus, the cone can be used as a simple mechanism of constructing the scan chains. As previously described, if the test design has F scan cells and N scan chains are used, then the length of each scan chain is L, where L=F/N. Topological cones can be constructed for every observable point of the test design and sorted by size. Note that sorting by size provides lower possibility of conflicts with the scan chain to scan input assignment scheme used.

Starting with the inputs of each cone in the list created, the first L unassigned scan cells encountered can be assigned to a partition for the creation of a scan chain. The following L cells can be assigned to the next partition for the creation of another scan chain. This process can be continued until all scan cells are assigned to some scan chain partition. (Note that other types of analysis, including standard DFT analysis that considers routing and other constraints, can be used with or in lieu of the cone technique to construct the scan chains.)

Using this selection technique, most scan cells in a given cone will probably be either in the same scan chain or in scan chains immediately before/after the scan chain. Therefore, a majority of the scan cells that have values required by a test pattern are either in the same scan chain or in adjacent scan chains. (Note that the overlapping of cones may cause scan cells within a cone to not reside in the same or adjacent scan chains with scan cells in the same cone.) Scan chain membership based on cones can facilitate mappings that minimize conflicts.

Step 602 includes creating a mapping between the scan chains and the available scan inputs. While every scan chain could be selectively coupled to all the scan inputs, another mapping can facilitate minimizing analysis of the test design. Specifically, to maximize data volume reduction in one embodiment, the configuration using the largest scan-in fan-out (i.e. the smallest number of scan inputs) can be used first. If that configuration results in a conflict, then the number of scan inputs can be increased for the next configuration, thereby decreasing the probability of conflict. In other words, the fan-out is decreased only if necessary to avoid conflict. Therefore, in accordance with one use of the dynamically reconfigurable shared scan-in test architecture, various configurations can be used until no conflict occurs.

In one embodiment, each configuration could use a number of scan inputs that is relatively prime to the numbers used by other configurations. Thus, successive configurations could use 2, 3, 5, 7, 11 . . . scan inputs. Advantageously, using this succession of scan inputs and the previously established membership technique for scan cells means that a conflict occurring in one configuration can be eliminated by the next configuration.

In other words, a desired number of configurations can be determined by selecting configurations beginning with m=2 (wherein m is the number of scan inputs available for use in the configuration) and using relatively prime numbers for m. For any given configuration, the scan chains are assigned to the available scan inputs of the configuration such that every $m^{th}$ scan chain is connected to the same scan input.

For example, assume that three configurations of the common scan-in architecture are to be constructed with 12 scan chains. The scan chains can be numbered $sc_1, sc_2, \ldots, sc_{12}$ whereas the scan inputs can be numbered $si_1, si_2, \ldots, si_m$. The first configuration uses m=2 scan inputs. Thus, all the odd numbered scan chains are connected to scan input $si_1$ and all the even numbered scan chains are connected to scan input $si_2$. The second configuration uses m=3, where the scan chains connected to scan input $si_1$ are $sc_1$, $sc_4$, $sc_7$, $sc_{10}$, the scan chains connected to scan input $si_2$ are $sc_2$, $sc_5$, $sc_8$, $sc_{11}$ and the scan chains connected to scan input $si_3$ are $sc_3$, $sc_6$, $sc_9$, $sc_{12}$. The third configuration has five scan inputs, wherein scan input $si_1$ is connected to scan chains $sc_1$, $sc_6$, $sc_{11}$ scan input $si_2$ is connected to scan chains $sc_2$, $sc_7$, $sc_{12}$, scan input $si_3$ is connected to $sc_3$, $sc_8$, scan input $si_4$ is connected to scan chains $sc_4$, $sc_9$, and scan input $si_5$ is connected to scan chains $sc_5$, $sc_{10}$.

Notably, the mapping of the configurations repeat after the least common multiple of the configurations is achieved. Therefore, for example, if three configurations are defined, then there would be 2*3*5=30 unique mappings of scan inputs to scan chains. In this case, each mapping can use one 3-1 multiplexer (or logic that is equal to 6 two-input gates), thereby creating a total overhead of 180 gates for the input side, regardless of the number of scan chains.

Figure 7A:
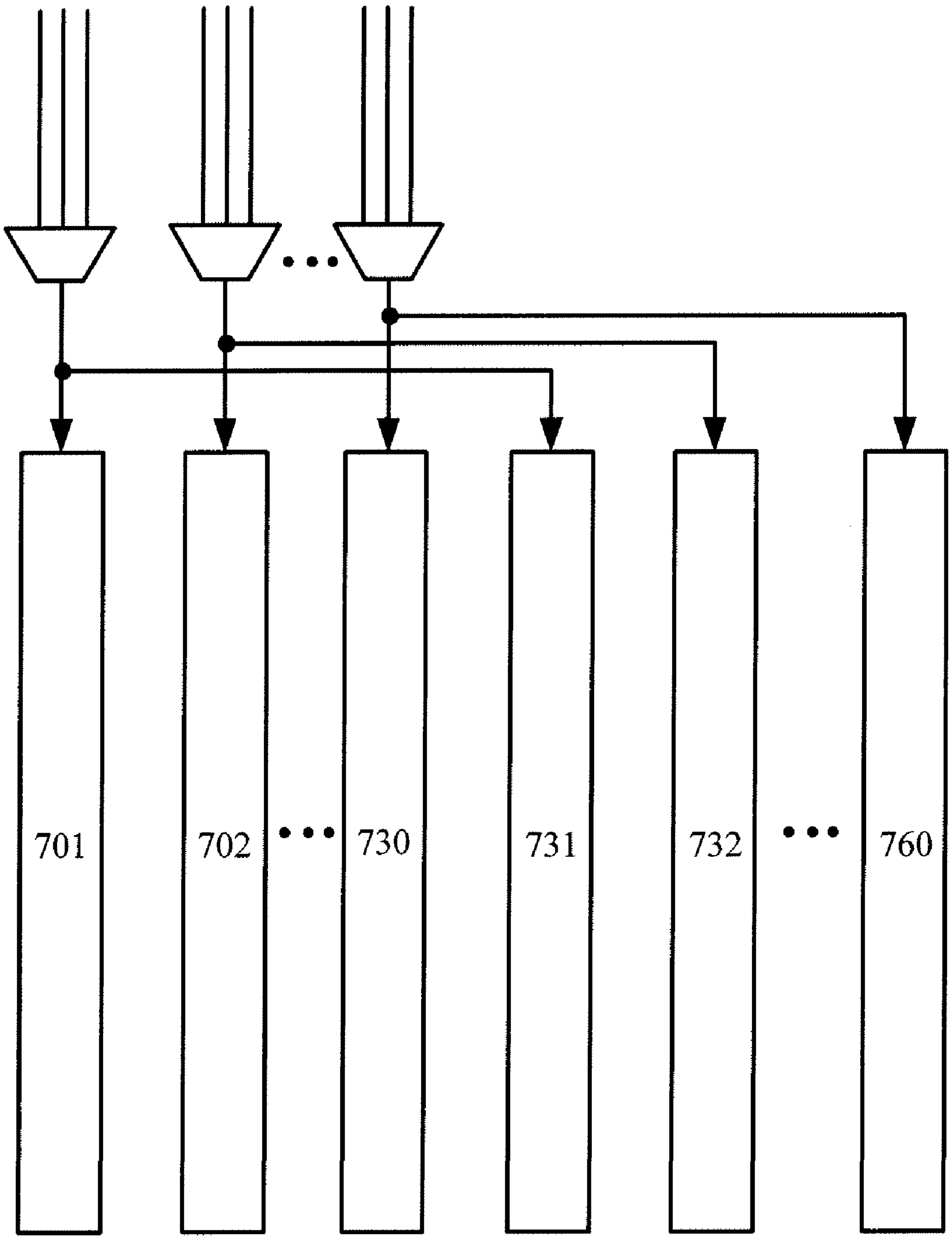
FIG. 7A illustrates another exemplary dynamically reconfigurable shared scan-in test architecture in which the multiplexer preceding one scan chain can be advantageously shared by another scan chain.

In this embodiment, the multiplexer preceding one scan chain can be advantageously shared by another scan chain. For example and referring to FIG. 7A (which shows 60 scan chains 701-760), assuming that m=5, which has 30 unique mappings, then scan chain 731 will receive the same scan input value as scan chain 701 (likewise scan chains 732 and 702 receive the same scan input value, and scan chains 760 and 730 receive the same scan input value). That is, the selective coupling of scan inputs to scan chains will repeat every 30 scan chains. Therefore, one can use N multiplexers provided for N scan chains or the number of multiplexers based on the number of unique mappings associated with the number of defined configurations (e.g. 30).

Figure 7B:
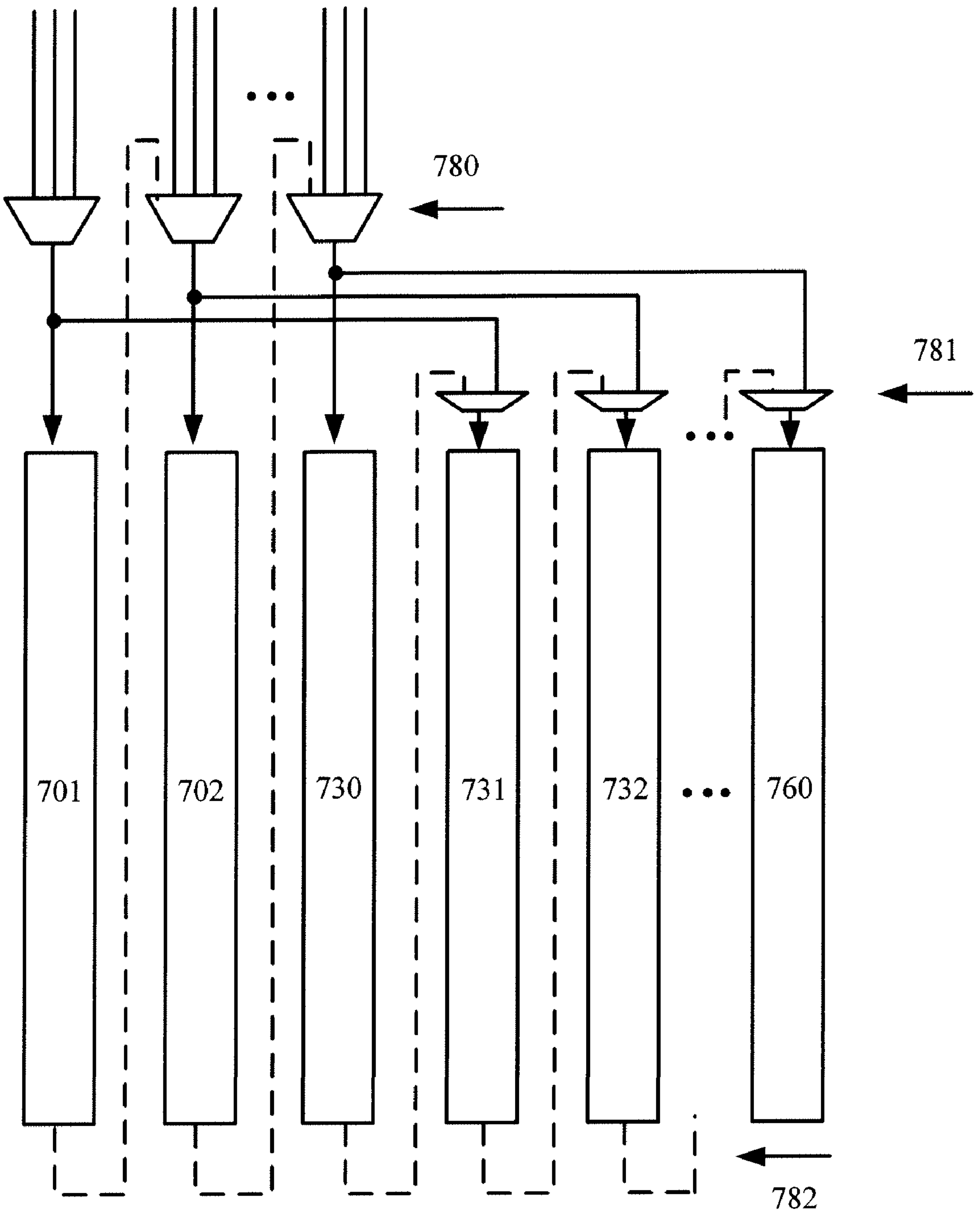
FIG. 7B illustrates yet another exemplary dynamically reconfigurable shared scan-in test architecture in which additional multiplexers can allow for the serial configuration of the scan chains.

Note that, in other embodiments, additional multiplexers can be provided to allow for a default serial configuration of the scan chains. For example, referring to FIG. 7B, if a predetermined number of configurations (e.g. 3) have been tried for a test design and still generate at least one conflict, then the scan chains can be reconfigured into a single serial scan chain using multiplexers 780, sub-multiplexers 781, and serial interconnect (shown as dashed lines) 782. Note that multiplexers 780 can be implemented with 4-to-1 multiplexers whereas multiplexers 781 can be implemented with 2-to-1 multiplexers.

The output side (not shown) can be implemented using a non-redundant XORing of the scan chains to the available scan outputs. In that configuration, the overhead would be one XOR per scan chain, which would be equivalent to 3 two-input gates. In another embodiment, the output side can be implemented using a MISR, which would result in a different area overhead.

The dynamically reconfigurable shared scan-in test architecture can significantly reduce test data volume, as will be demonstrated by reference to exemplary test designs (i.e. designs A, B, and C), which are described below in Table 1.

TABLE 1

Exemplary Circuits To Show DVR

| Design | Gates | Faults | Scan cells | Cone size: Max. inputs | Cone size: Max. gates |
|---|---|---|---|---|---|
| A | 230k | 481k | 9700 | 432 | 1887 |
| B | 390k | 554k | 12500 | 282 | 916 |
| C | 1083k | 2740k | 69000 | 264 | 5454 |

To maximize test data reduction in these designs, static configurations can be used first followed by dynamic configurations, as necessary. To determine test data volume, computations can be performed by first using the static configurations with the least number of scan pins (i.e. a small m to large m). Because using fewer scan pins (i.e. a smaller m) implies less test data volume, performing the computation using this priority highlights the test data volume reduction at the expense of some test application time. (In contrast, using all scan pins all the time would improve the test application time at the expense of test data volume.) An ATPG execution could bias its utilization of configurations to static configurations over dynamic configurations or, alternatively, immediately utilize the dynamic configurations.

The data volume reduction (DVR) can be calculated as follows. In general, the DVR can be represented by:

$$DVR=DV_{ATPG}/DV_{NEW}$$

$$DV_{ATPG}=\text{TestPatterns}*\text{ScanChains}*\text{MaxChainLength}(L)$$

$$DV_{NEW}=DV_{STATIC1}+DV_{STATIC2}+\ldots+DV_{STATICM}+DV_{DYNAMIC}$$

$$DV_{STATICi}=\text{Patterns in configuration } i*[\text{ScanPinsUsed}(m)*\text{MaximumChainLength}(L)+\text{UnusedScanPins}]$$

$$DV_{DYNAMIC}=\text{Dynamic patterns}*(\text{ScanPinsUsed}(m)+\text{ControlPins}(t))*\text{MaximumChainLength}(L)$$

In the static configurations, m bits of data can be loaded L times per patterns and each unused scan pin can be specified once in each vector. For dynamic testing, all the scan pins can be loaded L times for each pattern. Tables 2A and 2B show the results of these computations for the designs provided in Table 1 as well as for three larger ISCAS benchmark circuits (i.e. s13207, s38417, and s38584).

TABLE 2A

Computations Using Illinois Scan Architecture.

| Design | Chains | m | t | L | Regular ATPG Patterns | Illinois Scan: Broad. Pat. | Illinois Scan: Serial Pat. | Illinois Scan: DVR = TATR |
|---|---|---|---|---|---|---|---|---|
| A | 487 | 7 | 2 | 20 | 966 | 2138 | 218 | 4.27 |
| B | 516 | 7 | 2 | 26 | 748 | 1452 | 438 | 1.69 |
| C | 537 | 7 | 2 | 135 | 2361 | 3185 | 418 | 5.49 |
| S13207 | 80 | 7 | 2 | 11 | 149 | 157 | 78 | 1.80 |
| S38417 | 129 | 5 | 2 | 14 | 137 | 406 | 60 | 2.07 |
| S38584 | 139 | 7 | 2 | 13 | 230 | 286 | 142 | 1.57 |

TABLE 3B

Computations Using Dynamically Reconfigurable Architecture

| Design | Chains | m | t | L | Dynamically Reconfigurable Architecture: Patterns | Max m | DVR | TATR |
|---|---|---|---|---|---|---|---|---|
| A | 487 | 7 | 2 | 20 | 2910 | 1 | 64.42 | 18.04 |
| B | 516 | 7 | 2 | 26 | 2767 | 7 | 48.00 | 15.48 |
| C | 537 | 7 | 2 | 135 | 3715 | 7 | 138.6 | 35.82 |
| S13207 | 80 | 7 | 2 | 11 | 305 | 7 | 9.30 | 4.31 |
| S38417 | 129 | 5 | 2 | 14 | 731 | 5 | 9.14 | 3.43 |
| S38584 | 139 | 7 | 2 | 13 | 595 | 7 | 13.56 | 2.97 |

As shown by Tables 2A and 2B, the dynamically reconfigurable test architecture can overcome the dependencies caused by the common scan-in for significant benefits over the non-reconfigurable Illinois architecture. Max m=7 means that 4 configurations were implemented in the architecture (i.e. m=2, 3, 5 and 7). Similarly, Max m=5 means 3 reconfigurations were implemented and Max m=11 means 5 configurations were implemented.

The test application time (TAT) depends on the length of the longest scan chain during regular ATPG. In general, the TAT can be computed by:

$$TAT=TAT_{ATPG}/TAT_{NEW}$$

$$TAT_{ATPG}=\text{TestPatterns}*\text{MaximumChainLength}$$

$$TAT_{NEW}=TAT_{STATIC1}+\ldots+TAT_{STATICM}+TAT_{DYNAMIC}$$

$$TAT_{STATIC1}=\text{PatternsInConfiguration } i*\text{MaximumChain Length }(L)$$

$$TAT_{DYNAMIC}=\text{DynamicPatterns}*\text{MaximumChain Length }(L)$$

Table 3 compares using a static-only configuration and a combined static and dynamic configuration in the dynamically reconfigurable test architecture.

TABLE 3

Static and Dynamic Testing

| | Static Only | | | Static + Dynamic | | | |
|---|---|---|---|---|---|---|---|
| Design | Patterns | Configurations | Pins (m) | Total Patterns | Dynamic Patterns | Configurations | Pins (m) |
| A | 2922 | 6 | 13 | 2910 | 22 | 4 | 7 |
| B | 2780 | 5 | 11 | 2767 | 34 | 4 | 7 |
| C | 3712 | 5 | 11 | 3715 | 25 | 4 | 7 |
| S13207 | 305 | 5 | 11 | 305 | 6 | 4 | 7 |
| S38417 | 735 | 6 | 13 | 731 | 16 | 3 | 5 |
| S38584 | 562 | 6 | 13 | 595 | 45 | 4 | 7 |

To obtain these results, the number of configurations needed to apply all the patterns through the shared scan-in was determined. Then an execution was performed with fewer static configurations and a clean-up pass using the dynamic configuration to apply all the remaining patterns. As Table 3 indicates, the combined static and dynamic configurations significantly reduce the number of input pins that are needed compared to using static only configurations. Additionally, the combined static and dynamic configurations require fewer configurations compared to using static only configurations.

Although illustrative embodiments of the invention have been described in detail herein with reference to the figures, it is to be understood that the invention is not limited to those precise embodiments. They are not intended to be exhaustive or to limit the invention to the precise forms disclosed. For example, the multiplexers used in the reconfigurable shared scan-in test architecture can receive the same scan enable (i.e. control) signal or different scan enable signals.

Moreover, on the input side of the dynamically reconfigurable shared scan-in test architecture, many different mappings of the scan inputs to scan chain segments could exist. For example, in one embodiment, scan inputs can be mapped to scan chains using a rotation method. FIG. 8A illustrates a table showing exemplary rotation mappings for three scan inputs 0, 1, and 2, wherein each row of the table represents a configuration and each column of the table represents a scan chain.

Specifically, the top row, which represents a first configuration, has a zero rotation. That is, the ordering of the scan inputs does not change after each application of a scan input set (e.g. scan inputs 0, 1, and 2). Hence, if nine scan chains were provided (as shown in the table of FIG. 8A), the first, fourth, and seventh scan chains would receive scan input 0. The second, fifth, and eighth scan chains would receive scan input 1. Finally, the third, sixth, and ninth scan chains would receive scan input 2.

The middle row, which represents a second configuration, has a rotation of one. That is, the ordering of the scan inputs changes by one after each application of a scan input set. In this case, the first, sixth, and eighth scan chains would receive scan input 0. The second, fourth, and ninth scan chains would receive scan input 1. Finally, the third, fifth, and seventh scan chains would receive scan input 2.

The bottom row, which represents a third configuration, has a rotation of two. That is, the ordering of the scan inputs changes by two after application of a scan input set. In this case, the first, fifth, and ninth scan chains would receive scan input 0. The second, sixth, and seventh scan chains would receive scan input 1. Finally, the third, fourth, and eighth scan chains would receive scan input 2.

In accordance with one aspect of the invention, rotation mapping can be applied to any number of scan inputs. For example, FIGS. 8B, 8C, and 8D illustrate tables showing exemplary rotation mappings for four, five, and six scan inputs, respectively. Once again, each row of these tables can represent a configuration having a different rotation (e.g. the bottom row of the table in FIG. 8D has a rotation of four).

Many modifications and variations of the reconfigurable shared scan-in test architecture will be apparent. Accordingly, it is intended that the scope of the invention be defined by the following claims and their equivalents.

The invention claimed is:

1. A computer-readable storage device storing computer-executable instructions for forming a dynamically reconfigurable shared scan-in test architecture, which when executed by a computer performs steps comprising:

creating scan chains without association to scan inputs using cones of influence, wherein each cone of influence refers to a flip-flop and logic of a design driven by the flip-flop, and wherein a pair of flip-flops forming scan cells that belong to a same cone of influence are placed in a same scan chain to minimize potential conflict;

creating an association between the scan chains and a variable number of scan inputs until a number of potential conflicts between scan chains is minimized; and forming by using the computer the dynamically reconfigurable shared scan-in test architecture based on the association.

2. The computer-readable storage device of claim 1, wherein creating an association between the scan chains and the variable number of scan inputs includes defining a plurality of configurations.

3. The computer-readable storage device of claim 2, wherein defining the plurality of configurations includes using a predetermined number of scan inputs for each configuration.

4. The computer-readable storage device of claim 3, wherein the predetermined number of scan inputs is relatively prime to numbers used by other configurations.

5. The computer-readable storage device of claim 4, wherein successive configurations use 2, 3, 5, 7, 11 . . . scan inputs.

6. The computer-readable storage device of claim 2, wherein successive configurations use scan inputs whose sequence changes.

7. The computer-readable storage device of claim 2, wherein successive configurations use rotated scan inputs.

8. A method of forming a dynamically reconfigurable shared scan-in test architecture, the method comprising:

creating scan chains without association to scan inputs using cones of influence, wherein each cone of influence refers to a flip-flop and logic of a design driven by the flip-flop, and wherein a pair of flip-flops forming scan cells that belong to a same cone of influence are placed in a same scan chain to minimize potential conflict;

creating an association between the scan chains and a variable number of scan inputs until a number of potential conflicts between scan chains is minimized; and forming by using a computer the dynamically reconfigurable shared scan-in test architecture based on the association.

9. The method of claim 8, wherein creating an association between the scan chains and the variable number of scan inputs includes defining a plurality of configurations.

10. The method of claim 9, wherein defining the plurality of configurations includes using a predetermined number of scan inputs for each configuration.

11. The method of claim 10, wherein the predetermined number of scan inputs is relatively prime to numbers used by other configurations.

12. The method of claim 11, wherein successive configurations use 2, 3, 5, 7, 11 . . . scan inputs.

13. The method of claim 9, wherein successive configurations use scan inputs whose sequence changes.

14. The method of claim 9, wherein successive configurations use rotated scan inputs.

15. A method of forming a dynamically reconfigurable shared scan-in test architecture, the method comprising:

constructing cones for observable points of a test design, each cone including a flip-flop and logic driven by the flip-flop;

sorting the cones by size;

starting with a largest cone and proceeding to a smallest cone, assigning a predetermined number of unassigned scan cells of the cones to each scan chain;

creating an association between a plurality of scan chains and a variable number of scan inputs until a number of potential conflicts between scan chains is minimized; and forming by using a computer the dynamically reconfigurable shared scan-in test architecture based on the association.

16. The method of claim 15, wherein creating an association between the scan chains and the variable number of scan inputs includes defining a plurality of configurations.

17. The method of claim 16, wherein defining the plurality of configurations includes using a predetermined number of scan inputs for each configuration.

18. The method of claim 17, wherein the predetermined number of scan inputs is relatively prime to numbers used by other configurations.

19. The method of claim 18, wherein successive configurations use 2, 3, 5, 7, 11 . . . scan inputs.

20. The method of claim 16, wherein successive configurations use scan inputs whose sequence changes.

21. The method of claim 16, wherein successive configurations use rotated scan inputs.

22. A method of forming a dynamically reconfigurable shared scan-in test architecture, the method comprising:

constructing cones for observable points of a test design, each cone including a flip-flop and logic driven by the flip-flop;

sorting the cones by size;

starting with a largest cone and proceeding to a smallest cone, assigning a predetermined number of unassigned scan cells of the cones to each scan chain;

creating an association between a plurality of scan chains and a variable number of scan inputs until a number of potential conflicts between scan chains is minimized; and forming by using a computer the dynamically reconfigurable shared scan-in test architecture based on the association.

23. The method of claim 22, wherein creating an association between the scan chains and the variable number of scan inputs includes defining a plurality of configurations.

24. The method of claim 23, wherein defining the plurality of configurations includes using a predetermined number of scan inputs for each configuration.

25. The method of claim 24, wherein the predetermined number of scan inputs is relatively prime to numbers used by other configurations.

26. The method of claim 25, wherein successive configurations use 2, 3, 5, 7, 11 . . . scan inputs.

27. The method of claim 23, wherein successive configurations use scan inputs whose sequence changes.

28. The method of claim 23, wherein successive configurations use rotated scan inputs.

29. A computer-readable storage device storing computer-executable instructions for forming a dynamically reconfigurable shared scan-in test architecture, which when executed by a computer performs steps comprising:

constructing cones for observable points of a test design, each cone including a flip-flop and logic driven by the flip-flop;

sorting the cones by size;

starting with a largest cone and proceeding to a smallest cone, assigning a predetermined number of unassigned scan cells of the cones to each scan chain;

creating an association between a plurality of scan chains and a variable number of scan inputs until a number of potential conflicts between scan chains is minimized; and forming by using a computer the dynamically reconfigurable shared scan-in test architecture based on the association.

30. The computer-readable storage device of claim 29, wherein creating an association between the scan chains and the variable number of scan inputs includes defining a plurality of configurations.

31. The computer-readable storage device of claim 30, wherein defining the plurality of configurations includes using a predetermined number of scan inputs for each configuration.

32. The computer-readable storage device of claim 31, wherein the predetermined number of scan inputs is relatively prime to numbers used by other configurations.

33. The computer-readable storage device of claim 32, wherein successive configurations use 2, 3, 5, 7, 11 . . . scan inputs.

34. The computer-readable storage device of claim 30, wherein successive configurations use scan inputs whose sequence changes.

35. The computer-readable storage device of claim 30, wherein successive configurations use rotated scan inputs.

* * * * *